US006812716B2

(12) United States Patent
Fawcett

(10) Patent No.: US 6,812,716 B2
(45) Date of Patent: Nov. 2, 2004

(54) METHOD AND APPARATUS FOR TESTING AN ELECTRICAL COMPONENT

(75) Inventor: Timothy J. Fawcett, Yoxall (GB)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 10/460,679

(22) Filed: Jun. 13, 2003

(65) Prior Publication Data
US 2004/0027140 A1 Feb. 12, 2004

(30) Foreign Application Priority Data
Jun. 25, 2002 (GB) ............................................. 0214692

(51) Int. Cl.[7] .......................... G01R 1/00; G01R 27/08
(52) U.S. Cl. ........................ 324/707; 324/557; 324/521
(58) Field of Search .................................. 324/512, 539, 324/519–523, 544, 557, 659, 707, 709–713

(56) References Cited

U.S. PATENT DOCUMENTS 3,766,469 A * 10/1973 Nakane ........................ 324/659
4,410,851 A * 10/1983 Goffaux ....................... 324/546
5,818,245 A * 10/1998 Allfather ...................... 324/707
6,078,180 A * 6/2000 Jenkinson .................... 324/536
6,208,945 B1 3/2001 Koda et al. .................... 702/60

FOREIGN PATENT DOCUMENTS

EP         0 600 726 A2   6/1994
JP         61-54463       3/1986

* cited by examiner

Primary Examiner—Vincent Q. Nguyen
(74) Attorney, Agent, or Firm—Garrett V. Davis; Alfred N. Goodman

(57) ABSTRACT

A process and an apparatus for measuring the impedance of a capacitive sample and thereby determining the leakage impedance and the loss angle. To suppress the effects of ambient power frequency fields coupling onto the test object, measuring frequencies on either side of the line frequency are imposed onto the test object. The voltage and current are captured using a detection system. These signals are digitised and processed using a computer to determine the real and imaginary voltages and currents at the two test frequencies. These components are then analysed to calculate the leakage impedance and phase angle at the two frequencies. By applying a linear interpolation between the two points, the impedance and loss angle at the line frequency can be measured.

10 Claims, 2 Drawing Sheets

METHOD AND APPARATUS FOR TESTING AN ELECTRICAL COMPONENT

FIELD OF THE INVENTION

This invention relations to a method and apparatus for use in the testing of an electrical component. More especially, the invention relates to a means of testing an electrical characteristic at a given frequency in such a manner as to avoid the effects of interference occurring in a test circuit at the said given frequency. The invention is particularly applicable to testing to be effected in a power system in which interference may occur owing to spurious voltages and currents induced in the test circuit owing to the presence of power line frequency fields.

More especially, the invention relates to a method and the implementation of that method to be used as a means of measuring the leakage impedance and loss angle of a high voltage component or insulation system as a tool by which the condition of said component or insulation system can be assessed as part of the installation and maintenance procedures.

BACKGROUND OF THE INVENTION

The condition of insulation systems can be assessed by measuring the loss angle (or δ), which gives a measure of the performance of the insulation. An ideal insulation system behaves as an ideal capacitor in that when the system is energised with an alternating voltage, the current that flows in the insulation system is exactly 90° out of phase with the voltage. A real insulator, though, has a finite resistance that appears in parallel with the ideal capacitance, which causes an energy loss when the system is energised. This resistance reduces the phase angle of the current with respect to the voltage. The angle of this phase shift is the loss angle (δ). The higher the loss angle, the more resistive the insulation system is. The loss is normally measured in terms of tan (δ), which is given by C/R where C is the capacitance of the insulation system and R is the loss resistance. One of the indicators of a degrading insulation system is the value (δ) increasing over time.

Tan (δ) has been measured in the past using bridge balancing methods such as the Schering bridge, or an inductively coupled ratio arm bridge (e.g. Tettex type 2805). Later systems have used direct measurement of the voltage and current with electronic processing of the resulting signals to measure the tan (δ) factor. One of the limitations with this method is the presence of power line frequency fields that induce spurious voltages and currents onto the test object and the system. These prevent a true measurement of the loss angle being made.

Ways of reducing the effect of this interference have been developed. The simplest is to choose a frequency that is slightly away from the line frequency, using this to energise the test object. The voltage and current are measured using synchronous detection or interference of the waveforms. This method relies on the assumption that the loss angle is constant with respect to frequency, which cannot be guaranteed an alternative is to measure on either side of the line frequency and perform a linear interpolation of the results to establish the loss angle at the line frequency. Hitherto this has required the use of complex synchronous schemes requiring accurate phase shift elements or multiple discrete measurements with complex digital signal processing noise suppression.

SUMMARY OF THE INVENTION

It is accordingly an object of the present invention to provide an improved method and means that overcomes, or at least reduces, the disadvantages referred to above.

In accordance with one aspect of the invention there is provided a method of measuring the insulation impedance of a capacitative electrical component at a power line frequency comprising the steps of generating a test signal having a composite waveform consisting of two sinusoids at first and second frequencies respectively above and below said power line frequency, applying said test signal to a test circuit including said electrical component, sampling the applied test signal, synchronously with the generation thereof, at a sampling frequency that is an integer multiple of each of said first and second frequencies, for a sampling period corresponding to an integral number of cycles of each of said first and second frequencies, in order to derive and store corresponding digital values of said applied test signal, calculating, from said stored values, for each of said frequencies, values of voltage applied to and current flowing in said electrical component in order to derive respective values corresponding to the insulation impedance of the component at said frequencies, and interpolating from said derived values to obtain a value at the power line frequency.

The invention also provides an apparatus for use in measuring a characteristic of an electrical component or circuit at a given frequency, comprising means for generating a test signal having a waveform consisting of two sinusoids at different frequencies respectively above and below said given frequency, means for applying said test signal to a test circuit, means for sampling values of signals at points in said test circuit synchronously with the generation of said test signal, at a sampling frequency that is an integral multiple of each of said different frequencies, for a sampling period corresponding to an integral number of cycles of each of said different frequencies, and for storing said sampled values in digital form, and data processing means programmed to process said stored values in order to derive, by interpolation from values calculated for said different frequencies, the value of said characteristic at said given frequency.

BRIEF DESCRIPTION OF THE DRAWINGS

Further preferred features and advantages of the invention will become apparent from the following description and the appended claims, taken in conjunction with the drawings in which:

DETAILED DESCRIPTION OF THE INVENTION

Figure 1:
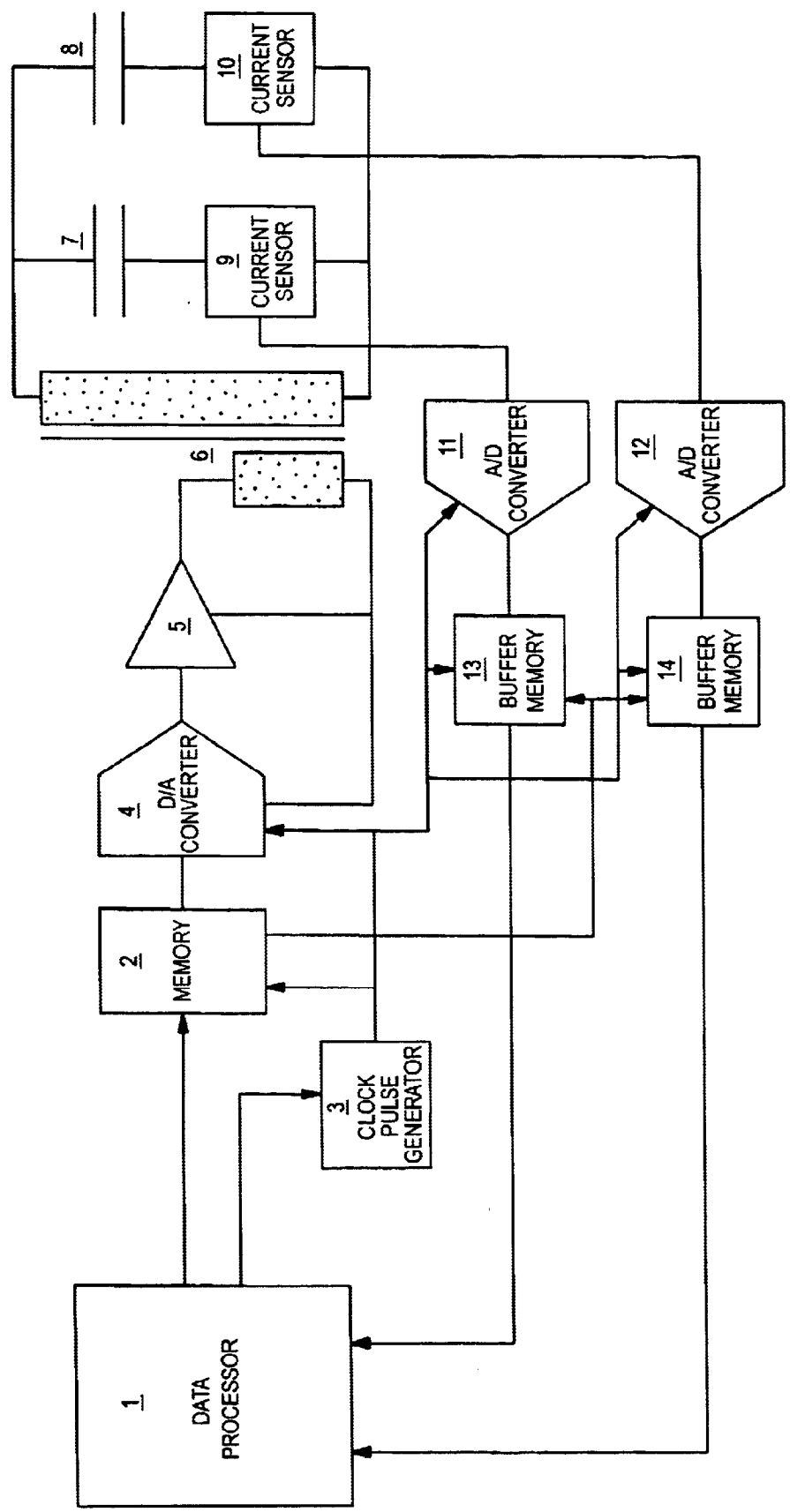
FIG. 1 is a block circuit diagram of an apparatus in accordance with the invention.

In this invention, the energising signal applied to the object under test consists of a combination of two frequencies, spaced on either side of the power line frequency. These are applied to the test object simultaneously. The voltage across and the current through the component are digitised simultaneously and processed off-line by a computer system. To measure the loss angle at the two frequencies, the frequency components are extracted using Fourier transform techniques.

To use Fourier transform methods to extract the frequency components, two criteria must be met:

1) For each frequency to be considered, it is necessary that an integral number of cycles is captured and processed.
2) For each frequency of interest, it is necessary that the sa frequency used is an integer multiple of the frequency to be measured.

These criteria make the selection of the memory depth that is required an the sampling frequency critical for the reliable measurement of the components.

The simplest case that allows these criteria to be met is when the two measurement frequencies are spaced equally in frequency around the power line frequency.

Let $f_L$=the power line frequency,
$f_1$=lower measurement frequency,
$f_2$=upper measurement frequency
$f_\Delta$=spacing frequency Then $f_1 = f_L - f_\Delta$ (Equation 1)

$f_2 = f_L + f_\Delta$ (Equation 2)

If we define $k = f_L/f_\Delta$ (Equation 3)

then $f_1 = (k-1)f_\Delta$ (Equation 4)

$f_2 = (k+1)f_\Delta$ (Equation 5)

Now, if we make k an integer, $f_1$ & $f_2$ are both integer multiples of $f_\Delta$ therefore if we make the sampling period = $1/f_\Delta$ then we can meet criterion 1.

Let $f_s$=the sampling frequency.

To meet criterion 2, we need the sampling frequency to be an integer multiple of both $f_1$ & $f_2$.

So $f_s = (k+1)f_1$ (Equation 6)

$f_s = (k-1)f_2$ (Equation 7)

but substituting for $f_2$ from Equation 5 into Equation 7 we get $f_s = (k-1)(k+1)f_\Delta$ (Equation 8)

or $f_s = (k^2-1)f_\Delta$ (Equation 9)

So we can define the minimum number of samples to meet criteria one for both measurement frequencies to be $(k^2-1)$. We can also define the sampling frequency required to meet criterion 2 by combining equations 4 and 9 to give $f_s = ((k^2-1)/k)f_L$.

So, we can tabulate the required minimum sampling frequencies and minimum sample lengths for particular values of K:

| k | % of $f_L$ | Min. Samples | $f_s/f_L$ |
|---|---|---|---|
| 2 | 50% | 3 | 1.5 |
| 3 | 33% | 8 | 2.6667 |
| 4 | 25% | 15 | 3.75 |
| 5 | 20% | 24 | 4.8 |
| 10 | 10% | 99 | 9.9 |
| 15 | 6.667% | 224 | 14.933 |
| 20 | 5% | 399 | 19.95 |
| 50 | 2% | 2499 | 49.98 |

So for any line frequency we can select a suitable sampling frequency and record length that allows both criteria one and criteria 2 above to be met. For practical tan ($\delta$) measurement the number of samples required is significantly greater, because it is necessary to resolve the phase differences to a sufficient accuracy. However as long as the frequency selected is an integer multiple of $f_s$, and the record length is the same integer multiple of $(K^2-1)$ criteria 1 and 2 above will continue to be met.

To extract the frequency components, it is necessary to use a complex Discrete Fourier transform on the captured data. This will require an arbitrary length complex transform to be performed on the data.

Let N=Number of samples=$a.(k^2-1)$
Sampling Frequency=$a.f_s = a.(k^2-1)f_\Delta$
Where a is an integer value
The Discrete Fourier Transform is given by $$X[m] = \sum_{n=0}^{N-1} x[n]\cos(2\pi mnFT) + j\sum_{n=0}^{N-1} x[n]\sin(2\pi mnFT)$$

for $m = 0, 1, \ldots N - 1$

However, we are only interested in two specific frequency components, the rest can be considered to be noise for the purposes of the measurement it is not necessary to calculate all the terms, only a F1 and f2, that is when m=(k-1) and when M=(k+1). If the captured voltage waveform is v[n] and the captured current and the captured current waveform is i[n] we can calculate the complex voltage and current at the two measuring frequencies thus $$V_{f_1} = \sum_{n=0}^{N-1} v[n]\cos\left(2\pi(k-1)\frac{n}{N}\right) + j\sum_{n=0}^{N-1} v[n]\sin\left(2\pi(k-1)\frac{n}{N}\right)$$ (equation 10)

$$I_{f_1} = \sum_{n=0}^{N-1} i[n]\cos\left(2\pi(k-1)\frac{n}{N}\right) + j\sum_{n=0}^{N-1} i[n]\sin\left(2\pi(k-1)\frac{n}{N}\right)$$ (equation 11)

$$V_{f_2} = \sum_{n=0}^{N-1} v[n]\cos\left(2\pi(k+1)\frac{n}{N}\right) + j\sum_{n=0}^{N-1} v[n]\sin\left(2\pi(k+1)\frac{n}{N}\right)$$ (equation 12)

$$I_{f_2} = \sum_{n=0}^{N-1} i[n]\cos\left(2\pi(k+1)\frac{n}{N}\right) + j\sum_{n=0}^{N-1} i[n]\sin\left(2\pi(k+1)\frac{n}{N}\right)$$ (equation 13)

Given the complex voltage and current component at each frequency, it is a simple matter to calculate the resistive and capacitive components of the sample impedance, and therefore to calculate the loss angle $\delta$ and the loss factor tan($\delta$).

In practice, the voltage applied to the test object is not measured directly. It is determined by using a process of calculation from the current flowing through a reference capacitor of known value and loss angle. In this case the currents through the reference capacitor are found at both measurement frequencies:

$$I_{Rf_1} = \sum_{n=0}^{N-1} i_r[n]\cos\left(2\pi(k-1)\frac{n}{N}\right) + j\sum_{n=0}^{N-1} i_r\sin\left(2\pi(k-1)\frac{n}{N}\right)$$ (equation 14)

$$I_{Rf_2} = \sum_{n=0}^{N-1} i_r[n]\cos\left(2\pi(k+1)\frac{n}{N}\right) + j\sum_{n=0}^{N-1} i_r[n]\sin\left(2\pi(k+1)\frac{n}{N}\right)$$ (equation 15)

The voltage applied to the test circuit can be calculated at each of these frequencies using the complex impedance of the reference capacitor. This consists of two components, a resistive component R and a capacitive component C. The impedance at a given frequency is given by:

$$Z_f = R_f + \frac{j}{2\pi f C_f}$$ (equation 16)

but R can be determined from the loss angle $$R_f + \frac{1}{2\pi f C_f}\tan(\delta) \quad \text{(equation 17)}$$

so if the capacitance and the loss angle of the reference capacitor at a given frequency can be determined, the complex voltage across the test sample can be determined from the current through the reference sample at the two measurement frequencies can be determined thus:

$$V_{f_1} = I_{Rf_1} \cdot \frac{1}{2\pi f_1 C_{f_1}} \cdot (\tan(\delta_{Rf_1}) + j) \quad \text{(equation 18)}$$

$$V_{f_2} = I_{Rf_2} \cdot \frac{1}{2\pi f_2 C_{f_2}} \cdot (\tan(\delta_{Rf_2}) + j) \quad \text{(equation 19)}$$

A practical implementation of the process outlined above will now be described with reference to the drawings.

Referring to FIG. 1, an apparatus in accordance with the invention comprises a data processor 1 equipped with a memory 2 for storing a look up table, and a clock pulse generator 3 serving to synchronise the operation of the components of the measurement system.

An output of the memory 2 is coupled to a digital to analogue converter 4 arranged to provide a test signal via a power amplifier 5 and an optional step up transformer 6. The output of the transformer 6 is coupled to a reference capacitor 7 of known capacitance and loss angle, and a test sample 8 coupled in parallel with the reference capacitor. A current sensor 9 is connected in series with the reference capacitor 7, and a current sensor 10 is likewise connected in series with the test sample 8. Outputs of the current sensors 9 and 10 are connected to inputs of analogue to digital converters 11 and 12, and the outputs of the analogue to digital converters 11 and 12 are coupled to inputs of buffer memories 13 and 14, of which outputs are coupled directly to the data processor 1. The operation of the look up table 2 and digital to analogue converter 4 on the one hand and the digital to analogue converters 11, 12 and the buffer memories 13, 14, on the other hand is controlled by the clock pulse generator 3 that is coupled to control inputs of the respective devices and serves to synchronise the generation of a test signal and the sampling of signal values in a manner described in more detail below.

The sampling frequency $f_s$ is generated by the clock generator 3. The sampling frequency is set by the data processor 1, or by the hardware configuration to be a.($k^2$−1)$f_A$. If the processor sets the interval, the system can more easily be adapted to work with different measurement frequency offsets or line frequencies than if the system is hard-coded. One advantage of the system, as described is that because the measurement frequencies are determined with respect to the sampling frequency and not the line frequency, the sampling frequency does not have to be synchronised to the line frequency and need not be an exact multiple of it. This does however limit the measurement frequency off set $f_A$. $f_A$ should be selected so that the likely variations in the local line frequency plus the uncertainty in $f_s$ should be less than $f_A$. If the system is not synchronised to the line frequency, the attenuation of the line frequency will be less than infinite, though if standard windowing functions used for frequency analysis are applied to the data, the effect of this lack of synchronisation will be significantly attenuated. Given that the line frequency components introduced onto the system are via pickup onto the test circuit, the line frequency components of the captured signal will be substantially less than the energising signal levels. Even without applying a window function, the effect of the processing described will greatly reduce their significance. The application of windowing functions will serve to enhance this rejection. The output of the clock generator is used to drive the energising frequency generation and the data capture system.

The energising waveform which is the sum of the two frequencies is generated using the look up table 2 and the digital to analogue converter 4. The look up table consists of a block of memory into which the computer loads the waveform that is to be used to energise the sample. This data is read out sequentially with the output being updated on the sample clock. The readout is reset after N samples (determined as above) have been read out. This data is fed to a digital to analogue converter which converts the digital values to voltage, constructing the actual waveform to be applied to the sample under test 8. The output of the digital to analogue converter is passed to the power amplifier 5 which provides sufficient energy to energise the sample under test 8 and the reference capacitor 7. Where a high voltage energisation is required, the additional step-up transformer 6 is used. The look up table 2 generates a reset signal when the readout is reset to the start which is used to trigger the capture of the waveform.

The energising signal is passed to the sample under test 8 and the reference capacitor 7. Both these units are grounded to the bottom of the energising supply through the current sensors 9 and 10. The current sensors measure the current flowing through each of the capacitors independently. The current in the reference capacitor is used to calculate and monitor the applied voltage to the test system as described above.

The outputs from the current sensors are passed to the analogue to digital converters 11 and 12 where the signal is converted to digital for later processing. This information is buffered using the memories 13 and 14. The writing into memory is controlled by the data processor and the look up table 2. The data processor signals the memories that it wishes the memory to be filled with the current information that is being picked up by the analogue to digital converters 13 and 14. The memories only start to be filled when the look up table 2 signals that its readout has been reset. This ensures that the first N entries in the memory correspond to one cycle of the energising signal with no phase shift imposed by the digitisation system. The data stored in the memories can then be read out by the data processor 1 and processed as described below.

Figure 2:
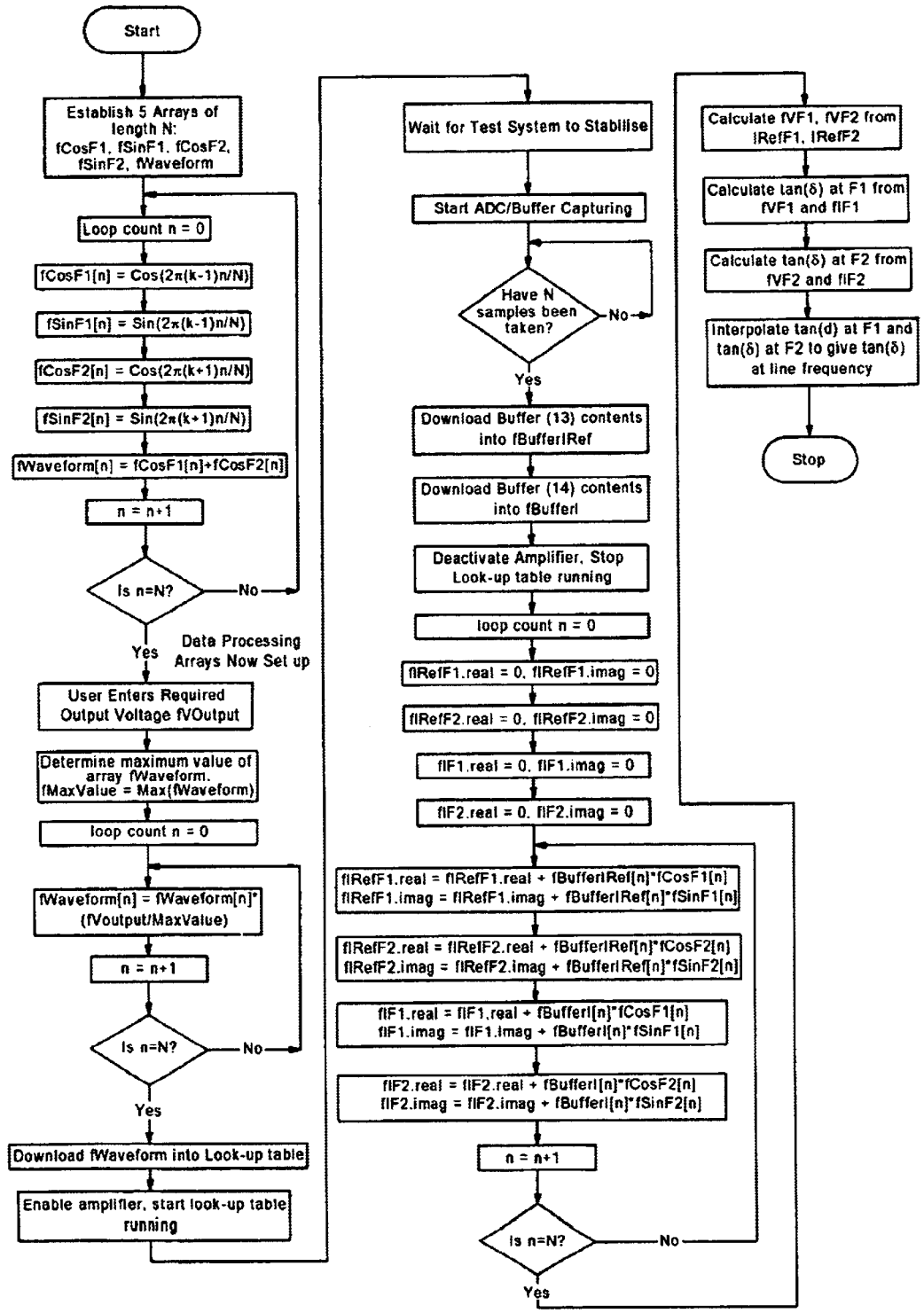
FIG. 2 is a flow chart illustrating the steps of a process to be carried out by the apparatus of FIG. 1.

FIG. 2 shows an exemplary realisation of the software to perform the measurement of tan δ utilising this invention. For the software, it is necessary to determine the number of samples N and the lower and upper measurement frequencies (F1 and F2), these parameters are defined by the user based on the calculations presented in the previous section. The system first allocates five arrays of length N. These are used to calculate the sine and cosine functions of F1 and F2 and the sum of the cosine functions F1 and F2. The use of both sine and cosine functions is not strictly necessary as one can be calculated from the other, but it does make the processing of the data easier and faster and acts as a convenience for the programmer implementing the algorithm. The sum of these two cosine functions defines the waveform required to energise the samples. This function is normalised to unity level so it is necessary for the user to provide a multiplier to define the required output level. The waveform array is multiplied by this value and the data is downloaded into the look up table. The software then enables the power system and starts the look up table running. This energises the sample with the composite waveform ready for the measurement process. The software waits for a short while to allow the sample and voltage generation system to stabilise and then enables the measurement system to capture the data.

Once data capture has been started, the unit waits until the appropriate number of samples has been taken and downloads the current waveforms from the ADC/Buffer system. Once the data has been downloaded into the processor, the real and imaginary current components at the two measurement frequencies can be calculated by applying equations 11, 13, 14 and 15 to the data. Once this has been done, the tan δ at the two frequencies of interest can be calculated for the sample and by a process of interpolation, the tan δ factor at the operating line frequency.

What is claimed is:

1. A method of measuring the insulation impedance of a capacitative electrical component at a power line frequency comprising the steps of generating a test signal having a composite waveform consisting of two sinusoids at first and second frequencies respectively above and below said power line frequency, applying said test signal to a test circuit including said electrical component, sampling the applied test signal, synchronously with the generation thereof, at a sampling frequency that is an integer multiple of each of said first and second frequencies, for a sampling period corresponding to an integral number of cycles of each of said first and second frequencies, in order to derive and store corresponding digital values of said applied test signal, calculating, from said stored values, for each of said frequencies, values of voltage applied to and current flowing in said electrical component in order to derive respective values corresponding to the insulation impedance of the component at said frequencies, and interpolating from said derived values to obtain a value at the power line frequency.

2. A method according to claim 1, wherein said test signal is generated digitally by calculating arrays of digital values defining the composite wave form, over a period of time at least equal to said sampling period, storing said values in a look up table, causing said values to be retrieved from the look up table at a clock pulse frequency and applying said retrieved values to a digital to analogue converter.

3. A method according to claims 2, wherein said clock pulse frequency is the same as the sampling frequency and is synchronised thereto.

4. A method according to claim 1, wherein said test signal is applied simultaneously to said component and to a reference component of known characteristics and wherein the said values of voltage applied to the said component are derived by calculation from sampled values of current flowing in the reference component.

5. A method according to claim 1, wherein complex values of voltage and current at each of said frequencies are derived from said stored digital values by Fourier analysis.

6. An apparatus for use in measuring a characteristic of an electrical component or circuit at a given frequency, comprising means for generating a test signal having a waveform consisting of two sinusoids at different frequencies respectively above and below said given frequency, means for applying said test signal to a test circuit, means for sampling values of signals at points in said test circuit synchronously with the generation of said test signal, at a sampling frequency that is an integral multiple of each of said different frequencies, for a sampling period corresponding to an integral number of cycles of each of said different frequencies, and for storing said sampled values in digital form, and data processing means programmed to process said stored values in order to derive, by interpolation from values calculated for said different frequencies the value of said characteristic at said given frequency.

7. An apparatus according to claim 6, wherein said means for generating said test signal comprises a data processing means including a memory, said data processing means being programmed to derive arrays of digital values defining said composite wave form over a period of time at least equal to said sampling period, and to store said derived digital values in said memory to provide a look up table, a digital to analogue converter, and clock pulse generating means for causing said values to be retrieved from said look up table and applied to an input of the digital analogue converter.

8. An apparatus according to claim 7, wherein said means for sampling includes at least one analogue to digital converter having an input for coupling to a point in said test circuit and a buffer controlled by said clock pulse generating means and having an input coupled to said analogue to digital converter and an output coupled to said data processing means for processing said stored values.

9. An apparatus according to claim 6, for use in measuring the loss angle and/or the insulation impedance of a capacitative component, and including a test circuit for application of said test signal to said component and to a reference component, said sampling means being arranged to sample and store values of current flowing in said component and said reference component, and said data processing means being programmed to calculate from said values, by Fourier analysis, complex components of voltage and current for said component at each of said different frequencies.

10. An apparatus according to claim 9, wherein said data processing means is further programmed to calculate the loss angle and/or the insulation impedance of said component at said given frequency by interpolation from values derived for each of said two different frequencies.

* * * * *